(12) United States Patent
Pai et al.

(10) Patent No.: US 8,203,082 B2
(45) Date of Patent: Jun. 19, 2012

(54) PRINTED CIRCUIT BOARD

(75) Inventors: Yu-Chang Pai, Taipei Hsien (TW); Shou-Kuo Hsu, Taipei Hsien (TW); Chien-Hung Liu, Taipei Hsien (TW); Ying-Tso Lai, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 405 days.

(21) Appl. No.: 12/272,797

(22) Filed: Nov. 18, 2008

(65) Prior Publication Data

US 2009/0294168 A1 Dec. 3, 2009

(30) Foreign Application Priority Data

May 27, 2008 (CN) .......................... 2008 1 0301792

(51) Int. Cl.
*H05K 1/11* (2006.01)

(52) U.S. Cl. ........ 174/266; 174/260; 174/262; 361/767; 361/783; 361/794; 333/1; 333/4; 333/238; 333/247; 257/758; 257/776

(58) Field of Classification Search .................. 174/266, 174/260–262; 361/767, 783, 794; 333/1, 333/4, 238, 247; 257/758, 776
See application file for complete search history.

(56) References Cited

U.S. PATENT DOCUMENTS

| | | | |
|---|---|---|---|
| 6,480,086 B1 * | 11/2002 | Kluge et al. | 336/200 |
| 6,828,876 B1 * | 12/2004 | Brooks et al. | 333/161 |
| 7,078,812 B2 * | 7/2006 | Frank et al. | 257/758 |
| 7,332,816 B2 * | 2/2008 | Hirose et al. | 257/776 |
| 7,684,764 B2 * | 3/2010 | Iwamoto et al. | 455/76 |
| 2004/0150970 A1 * | 8/2004 | Lee | 361/794 |
| 2005/0029013 A1 * | 2/2005 | Lee | 174/262 |
| 2006/0097820 A1 * | 5/2006 | Watanabe et al. | 333/26 |
| 2007/0001782 A1 * | 1/2007 | Sasaki et al. | 333/185 |
| 2007/0040627 A1 * | 2/2007 | Kanno et al. | 333/1 |
| 2007/0040628 A1 * | 2/2007 | Kanno et al. | 333/4 |
| 2007/0040634 A1 * | 2/2007 | Kanno et al. | 333/238 |
| 2007/0165389 A1 * | 7/2007 | Ahn | 361/767 |
| 2008/0174396 A1 * | 7/2008 | Choi et al. | 336/182 |
| 2008/0238585 A1 * | 10/2008 | Tokoro | 333/247 |
| 2009/0251876 A1 * | 10/2009 | Chen et al. | 361/783 |

* cited by examiner

*Primary Examiner* — Xiaoliang Chen
(74) *Attorney, Agent, or Firm* — Altis Law Group, Inc.

(57) ABSTRACT

A printed circuit board includes a first layout layer, a second layout layer, a copper foil layer, a first via and a second via. The first layout layer has a first signal line and a second signal line, each of which has a curved first portion. The second layout layer has a third signal line and a fourth signal line, each of which also has a curved first portion. The curved first portions of the first signal line, the second signal line, the third signal line and the fourth signal line are coupled to the first via and the second via. In this case, the curved first portions of the first signal line, the second signal line, the third signal line and the fourth signal line cooperatively generate spiral inductance characteristic.

20 Claims, 11 Drawing Sheets

PRINTED CIRCUIT BOARD

BACKGROUND

1. Technical Field

The invention relates to printed circuitry, and more particularly to a printed circuit board compensating for capacitance characteristics of a via stub.

2. Description of Related Art

A printed circuit board (PCB), such as a multilayer PCB used with a high-level server main board, a motherboard, or a backplane has signal layers, ground layers and source layers. Effective via technology is thus important in the PCB design.

As shown in FIGS. 5A and 5B, a lateral view and cross section of a PCB 1 such as multilayer PCB, PCB 1 has a plurality of copper foil layers 11, a first line layer 12, a second line layer 13, a pair of symmetrical vias 14A, 14B, an isolation layer 15 and a plurality of line layers 16. Each copper foil layer 11 has a symmetrical pair of void holes 11A, 11B both of which are disposed between the first line layer 12, the second line layer 13 and each line layer 16. The isolation layer 15 is disposed between each copper foil layer 11, the first line layer 12, the second line layer 13 and each line layer 16. The first line layer 12 is disposed on the second line layer 13. The vias 14A, 14B are disposed through the first line layer 12, the second line layer 13, the avoiding holes 11A, 11B and the isolation layer 15.

The first line layer 12 and the second line layer 13 have a pair of symmetrical first conductors 12A, 12B, symmetrical second conductors 13A, 13B, symmetrical first signal lines L1A, L1B, symmetrical second signal lines L2A, L2B. The first conductors 12A, 12B and the second conductors 13A, 13B, such as solder pads, are disposed around the vias 14A, 14B, respectively and correspond to the through holes 11A, 11B. The first signal lines L1A, L1B and the second signal lines L2A, L2B are coupled to the first conductors 12A, 12B and the second conductors 13A, 13B, respectively.

When the first signal lines L1A, L1B receive a pair of input signals S1, the input signals are transmitted through the first conductors 12A, 12B, the vias 14A, 14B, the second conductors 13A, 13B and output from the second signal lines L2A, L2B. The vias 14A, 14B below the second signal line layer 13 do not path the input signal S1, thus creating a via stub structure W, as shown in FIG. 5B, elevating capacitance and lowering impedance. thereby preventing the high frequency of the input signal S1 from passing, slowing the time wave. As shown in FIG. 5C, a channel response oscillogram, a curve C1 decays before the frequency reaches 9 GHz. Vias such as 14A, 14B, below the second signal line layer 13 and the second signal lines L2A, L2B act as branches, and the part of the input signal S1 is input to the vias 14A, 14B, and reflected back therethrough to generate multiple reflection, adding the original input signal S1 by the second signal lines L2A, L2B to bad effect, as shown in FIG. 5D and FIG. 5E. FIG. 5D is a serial signal eye diagram of the signal path including via stub structure W, causing input signal S1 to experience severe jitter and resulting high noise. FIG. 5E shows a serial signal eye diagram of the signal path with no via stub structure W.

FIG. 6 shows, in an attempt to improve the described problem, implementation of a process, after copper-plating of the vias, in which a drill D creates holes from line layers 16 of the PCB 1 to the first line layer 12 to completely clear the via stub structure W and reduce its effect.

However, the added process complicates manufacture of the PCB 1, and difficulty in ensuring precision of drill D positioning of the vias can result in decreased yield and increased costs.

What is needed, therefore, is a printed circuit board compensating for capacitance characteristics of a via stub requiring no added process.

DETAILED DESCRIPTION

Figure 1:
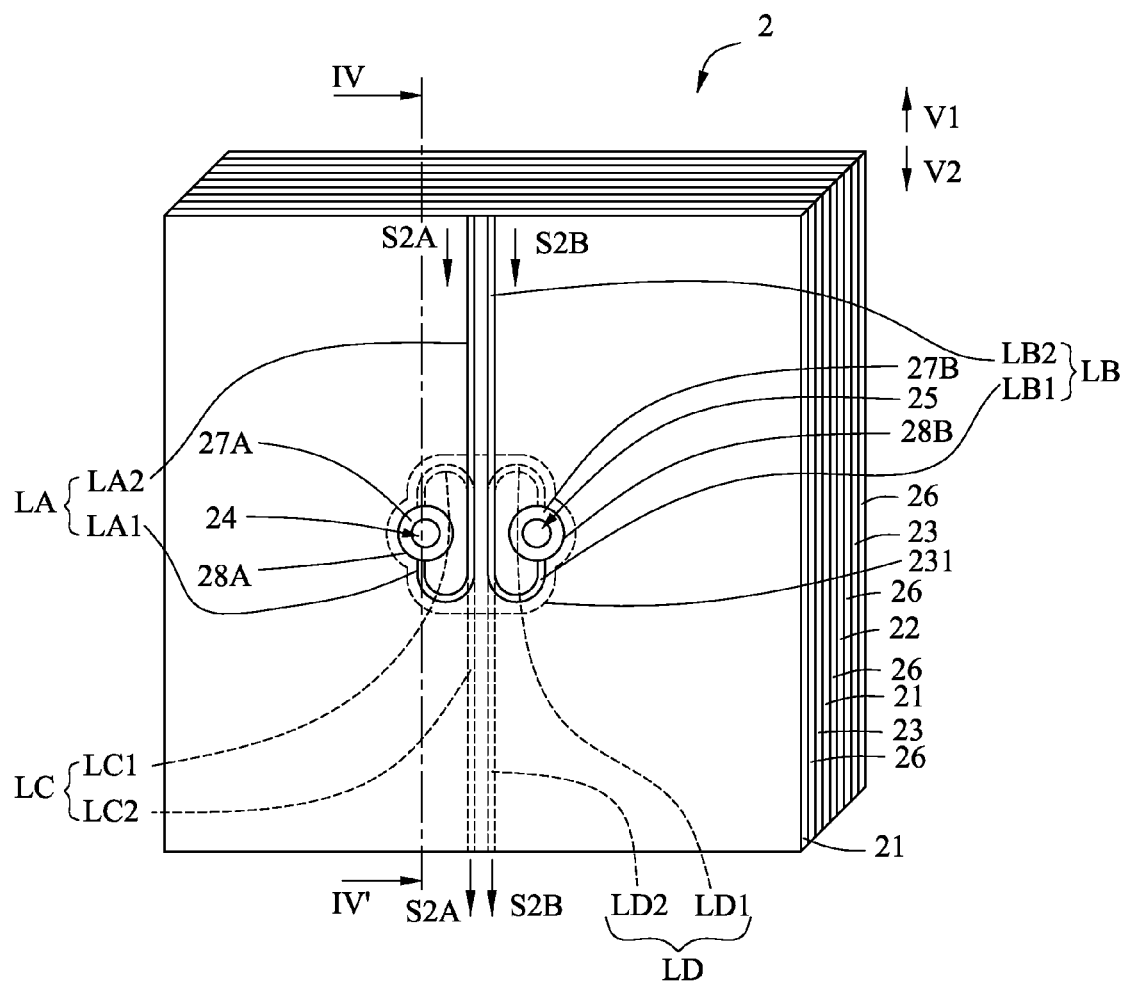
FIG. 1 is a side view of a printed circuit board, in accordance with the first embodiment of the disclosure.
Figure 2:
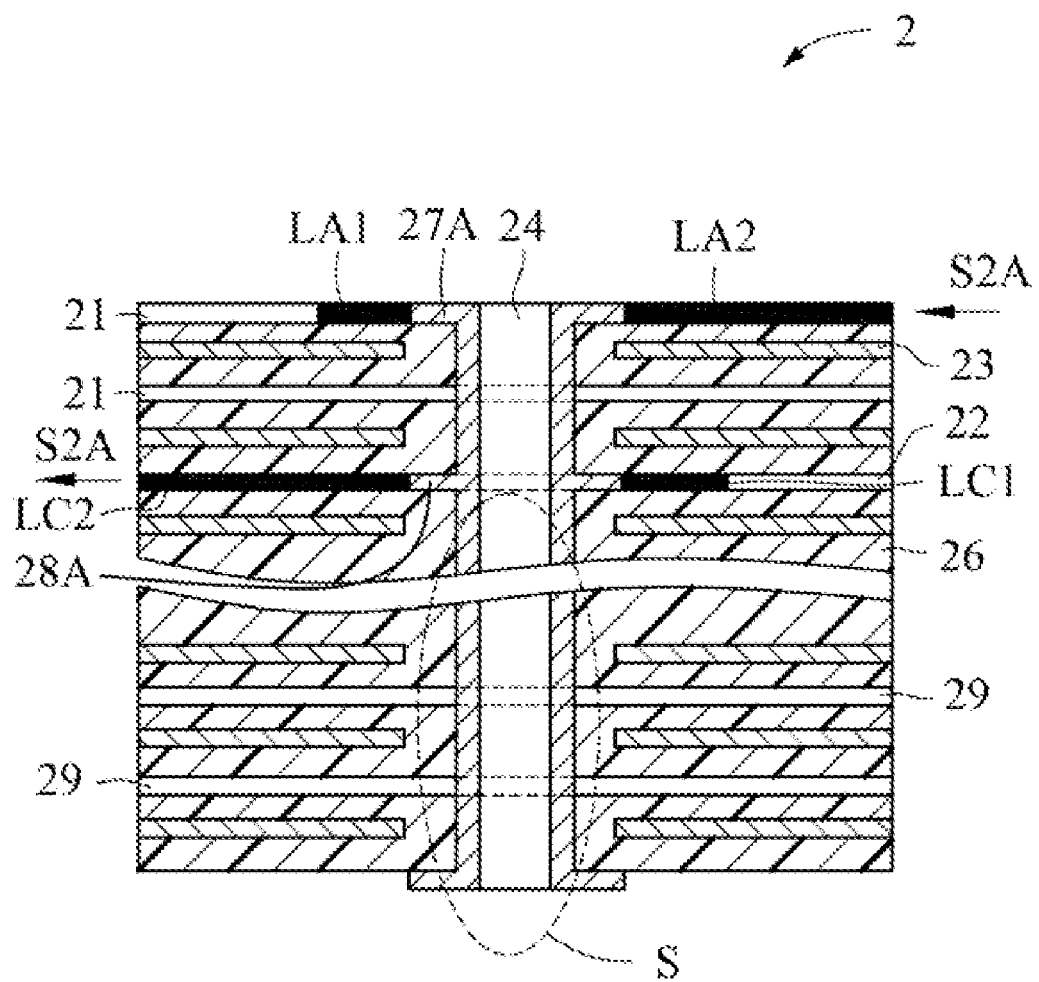
FIG. 2 is a cross section of the printed circuit board of FIG. 1 taken along line IV-IV'.

Referring to FIG. 1 and FIG. 2, a lateral view and a cross section of a printed circuit board (PCB) 2 of the first embodiment are shown. The PCB 2 includes a plurality of first layout layers 21, second layout layers 22, copper foil layers 23 and isolation layers 26, a first via 24, a second via 25, a pair of symmetrical first conducting portions 27A, 27B, and a pair of symmetrical second conducting portions 28A, 28B.

In this embodiment, the first layout layers 21 are disposed above the second layout layers 22. One of the copper foil layers 23 in the upper portion of the PCB 2 is disposed between two of the first and the second layout layers 21, 22. The isolation layers 26 are disposed to separate the first layout layers 21, the second layout layers 22 and the copper foil layers 23.

Figure 3A:
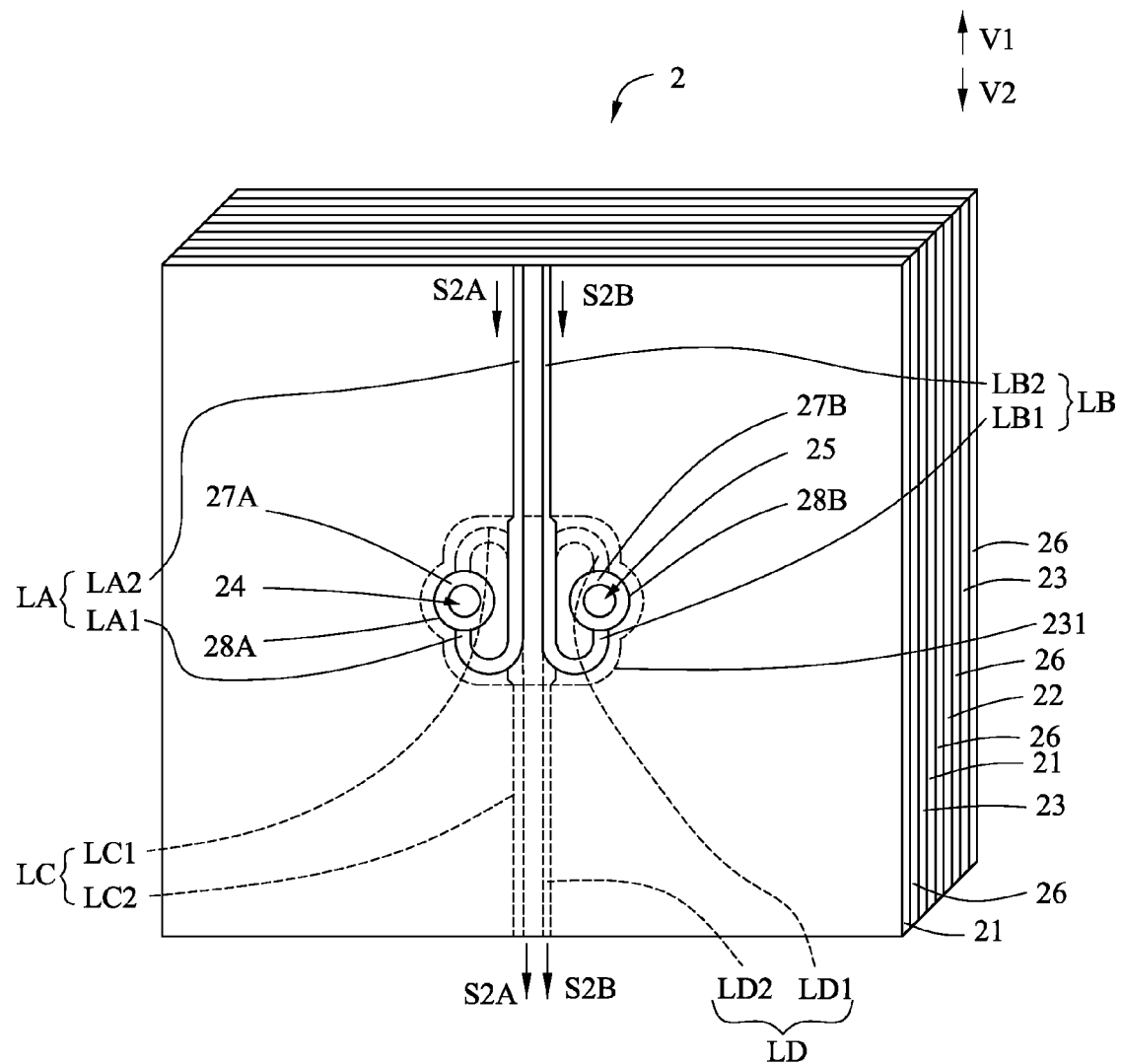
FIG. 3A is a side view of the printed circuit board of FIG. 1 showing widths of the curved first portions exceeding those of the straight second portions, in accordance with the disclosure.
Figure 3B:
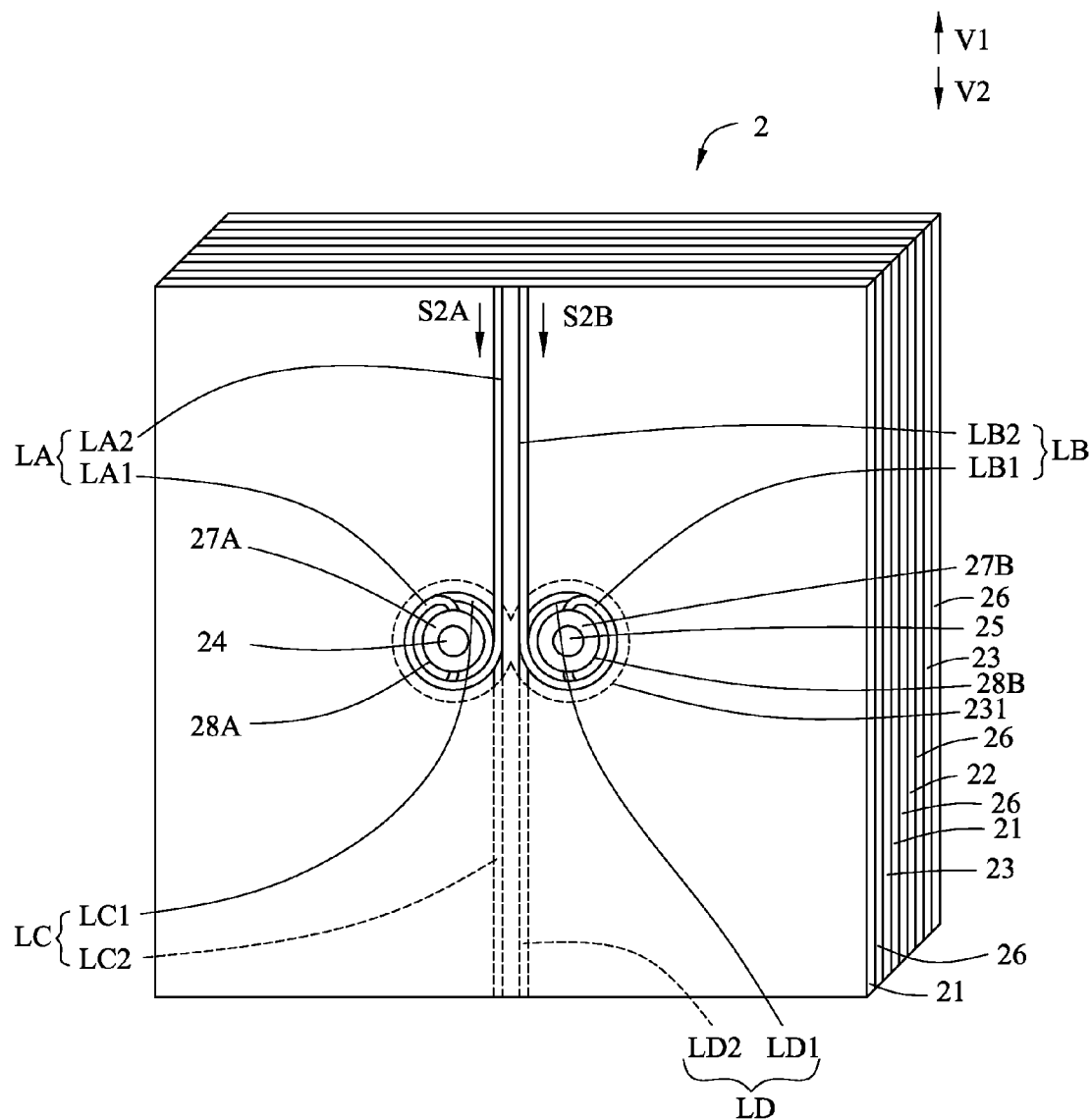
FIG. 3B is a side view of the printed circuit board showing the curved first portions of the first signal line and the second signal line disposed around the first via and the second via, in accordance with the second embodiment of the disclosure.

Each copper foil layer 23 includes an through hole 231 which is located in alignment. Shape of the through hole 231 may be any shape, and is irregular shown in this embodiment as seen in FIG. 1, FIG. 3A and in the second embodiment as seen in FIG. 3B.

The first conducting portions 27A, 27B are disposed on one of the first layout layers 21, and the second conducting portions 28A, 28B are disposed on one of the second layout layers 22. The first conducting portion 27A and the second conducting portion 28A are disposed around and coupled to the first via 24, and the second conducting portion 27B and the second conducting portion 28B are disposed around and coupled to the second via 25. The first conducting portions 27A, 27B and the second conducting portion 28A, 28B may be solder pads.

In this embodiment, the first layout layer 21, which has the first conducting portions 27A, 27B, includes a first signal line LA and a second signal line LB, which are symmetrical and disposed between the first via 24 and the second via 25. The first signal line LA includes a curved first portion LA1 and a straight second portion LA2 integrally connected together. The second signal line LB includes a curved first portion LB1 and a straight second portion LB2, both integrally connected.

The curved first portions LA1, LB1 are formed such that shadows thereof are cast within the area of corresponding through holes 231 of the copper foil layer 23, and coupled to the first via 24 and the second via 25 by the first conducting portions 27A, 27B.

In this embodiment, the curved first portions LA1, LB1 of the first signal line LA and the second signal line LB are disposed generally between the first via 24 and the second via 25, as shown in FIG. 1 and FIG. 3A, to cooperatively generate spiral inductance characteristics between the first layout layer 21 and the second layout layer 22 with respect to via stub portions S of third layout layers 29 which are around the first via 24 and the second via 25, thereby compensating the capacitance characteristics of the via stub portions S. In the second embodiment, the curved first portions LA1, LB1 of the first signal line LA and the second signal line LB are disposed around the first via 24 and the second via 25, as shown in FIG. 3B. Shapes of the curved first portions LA1 and the curved first portions LB1 may be any shape, and are generally J-shaped, as shown in FIG. 1 and FIG. 3A, generally C-shaped, as shown in FIG. 3B, or generally curved.

The widths of the curved first portions LA1, LB1 aren't limited, they may be bigger than the widths of the straight second portions LA2, 11LB2 of the first signal line LA and the second signal line LB, but shadows of the curve portions LA1, LB1 should not exceed the areas of the corresponding through holes 231, as shown in FIG. 3A.

Referring to FIG. 1 and FIG. 2, the second layout layer 22 has a third signal line LC and a fourth signal line LD, disposed symmetrically. The third signal line LC has a curved first portion LC1 and a straight second portion LC2 integrally connected together. The fourth line LD has a curved first portion LD1 and a straight second portion LD2 integrally connected together.

The third signal line LC and the fourth signal line LD are disposed generally between the first via 24 and the second via 25, and the curved first portions LC1, LD1 of the third signal line LC and the fourth signal line LD are formed such that shadows of the curved first portions LC1, LD1 are cast within an area of the corresponding through hole 231 of the copper foil layer 23.

Curved first portions LC1, LD1 of the third signal line LC and the fourth signal line LD are coupled to the first via 24 and the second via 25 by the second conducting portions 28A, 28B.

While curved first portions LC1, LD1 may be of any generally curved shape, they are, here, generally J-shaped, as shown in FIG. 1 and FIGS. 3A and C-shaped, as shown in FIG. 3B. Curved first portions LC1, LD1 can be disposed generally between the first via 24 and the second via 25, as shown in FIG. 1 and FIG. 3A, or generally around the first via 24 and the second via 25, as shown in FIG. 3B, to cooperatively generate spiral inductance characteristics between the first layout layer 21 and the second layout layer 22 with respect to via stub portions S of third layout layers 29 which are around the first via 24 and the second via 25, thereby compensating the capacitance characteristics of the via stub portions S. Widths of the curved first portions LC1, LD1 are not limited and can exceed those of the straight second portions LC2, LD2 of the third signal line LC and the fourth signal line LD, but shadows of the curved first portions LC1, LD1 need remain within the area of the corresponding through hole 231 of the copper foil layer 23, as shown in FIG. 3A.

Referring to FIG. 1, FIG. 3A and FIG. 3B, the setting direction V1 of the curved first portions LA1, LB1 of the first signal line LA and the second signal line LB is generally opposite to the setting direction V2 of the curved first portions LC1, LD1 of the third signal line LC and the fourth signal line LD, such that the shapes of the curved first portions LA1, LC1 and the overall construction of the curved first portions LB1, LD1 form a spiral and generate spiral inductance characteristics.

Referring to FIG. 1, the first signal line LA, the second signal line LB, the third signal line LC and the fourth signal line LD transmit a pair of signals S2A, S2B. For example, the signals S2A, S2B can be transmitted via the first signal line LA and the second signal line LB and the vias 24, 25 to be output from the third signal line LC and the fourth signal line LD. The signals S2A, S2B may be a pair of serial or differential signals.

Figure 4:
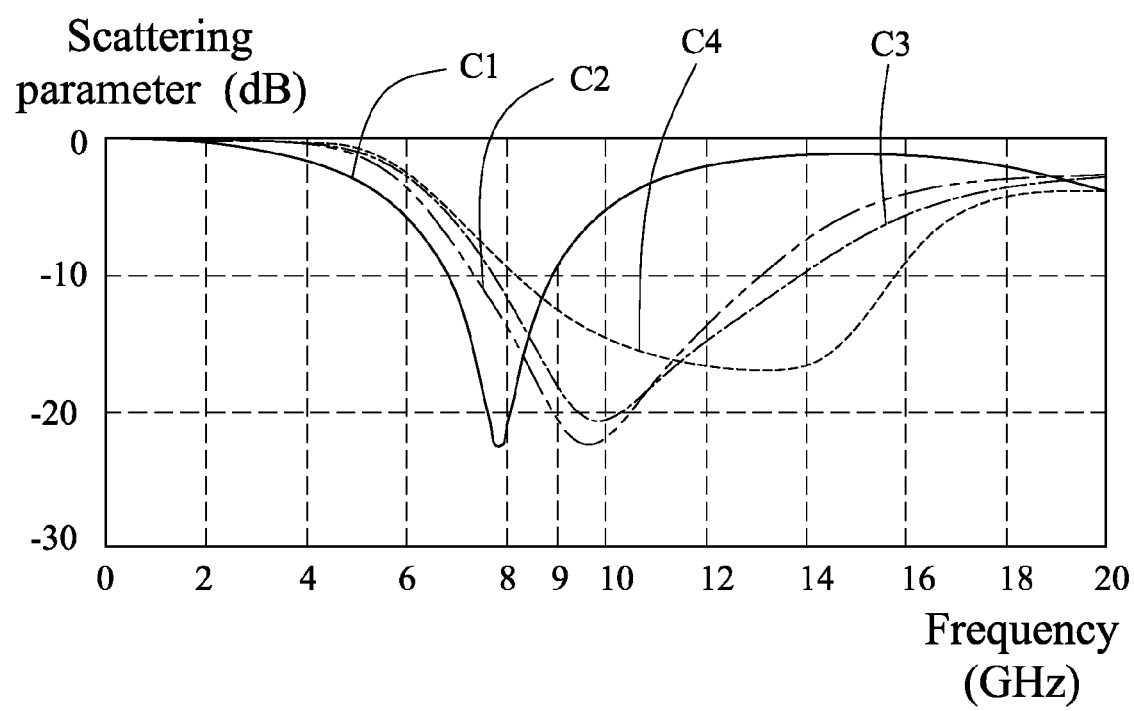
FIG. 4 shows an oscillogram of a channel response of the printed circuit board in accordance with the disclosure.
Figure 5A:
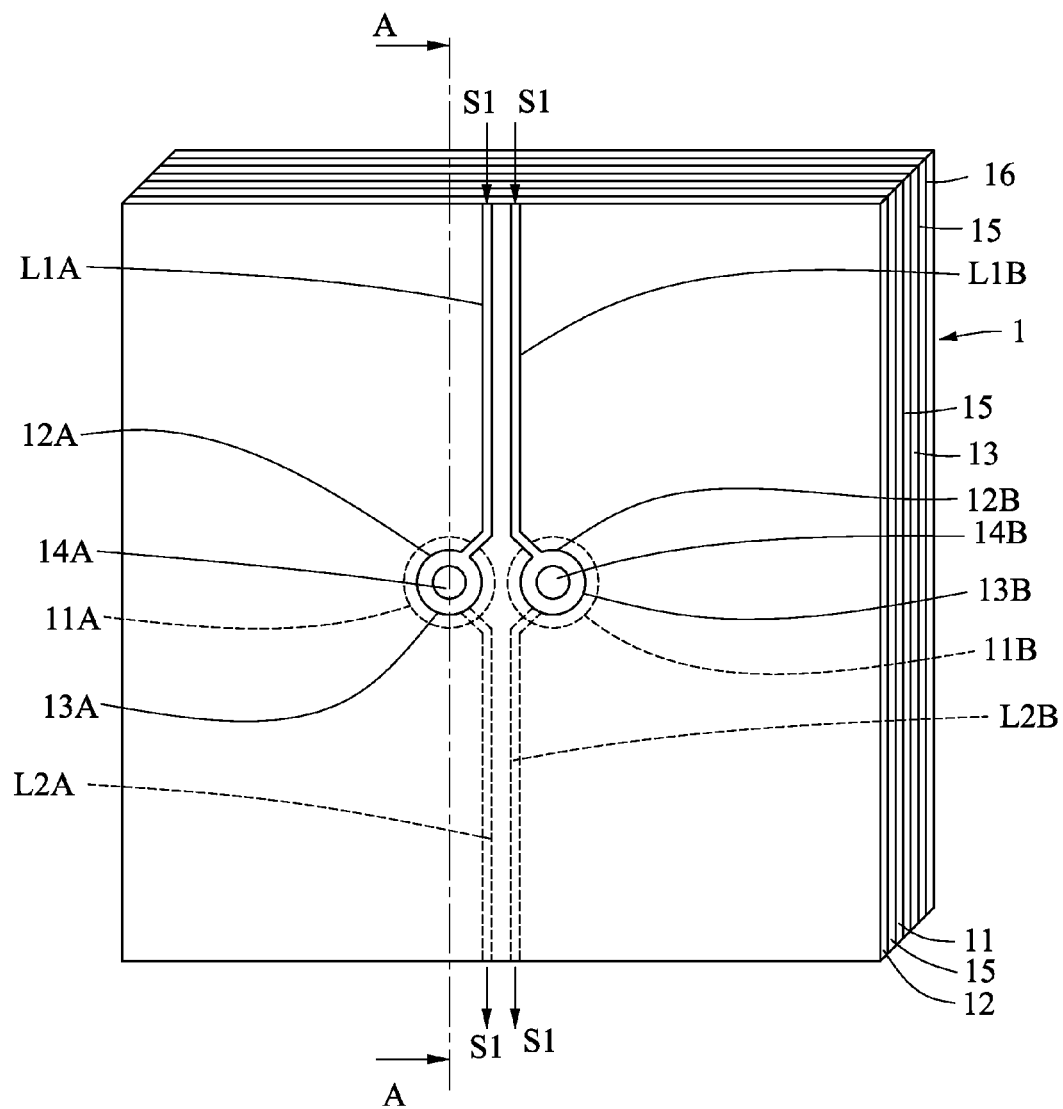
FIG. 5A is a side view of a commonly used printed circuit board.
Figure 5B:
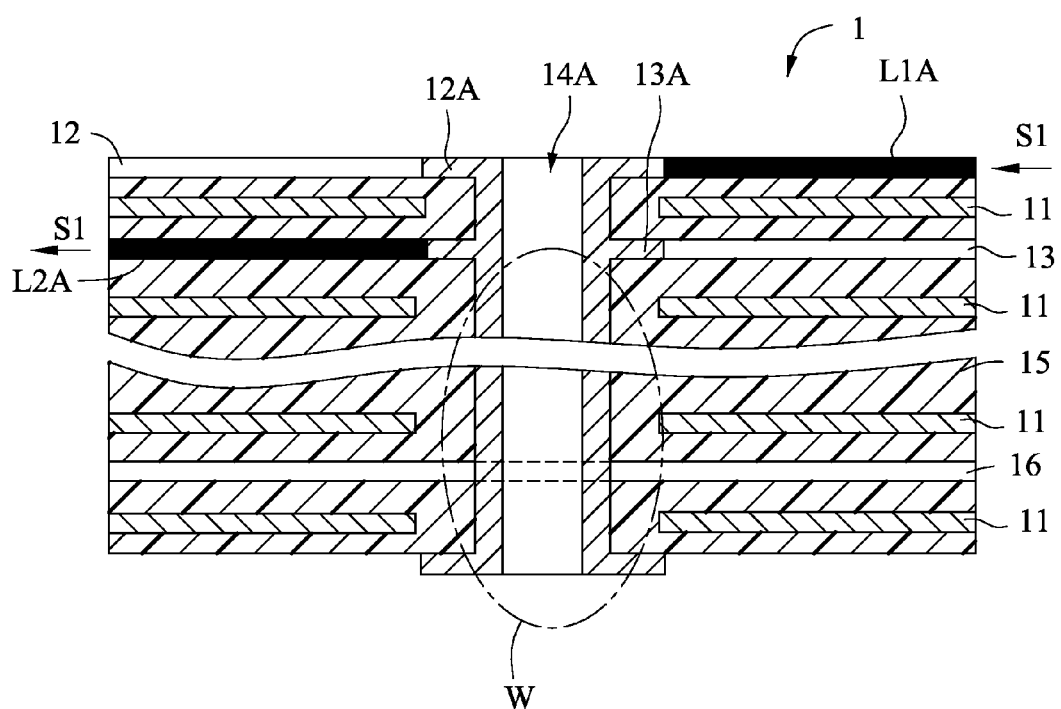
FIG. 5B is a cross-section of the printed circuit board of FIG. 5A.
Figure 5C:
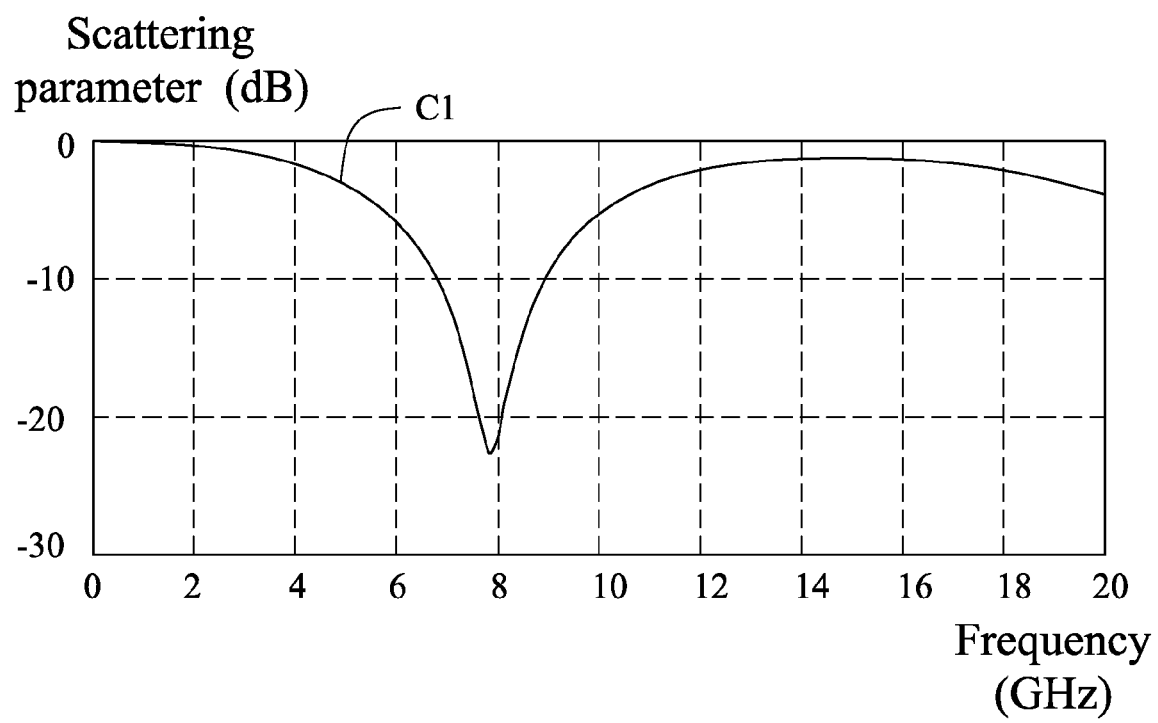
FIG. 5C shows an oscillogram of a channel response of the printed circuit board of FIG. 5A.
Figure 5D:
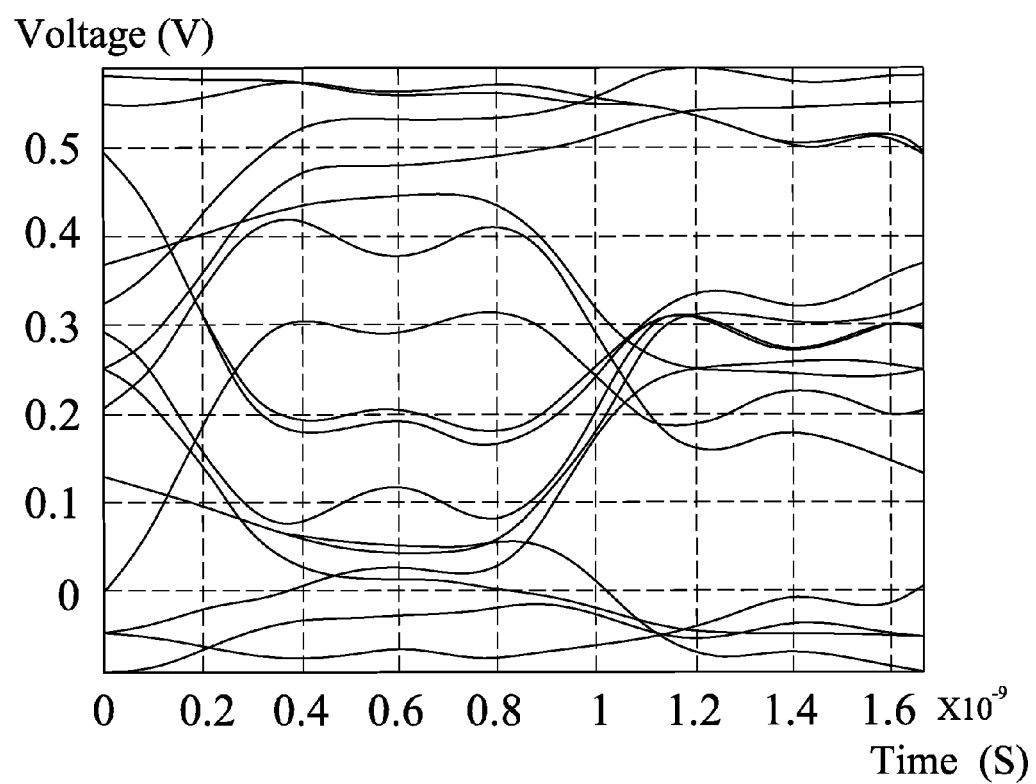
FIG. 5D is a serial signal eye diagram of the printed circuit board of FIG. 5A, showing a via stub structure.
Figure 5E:
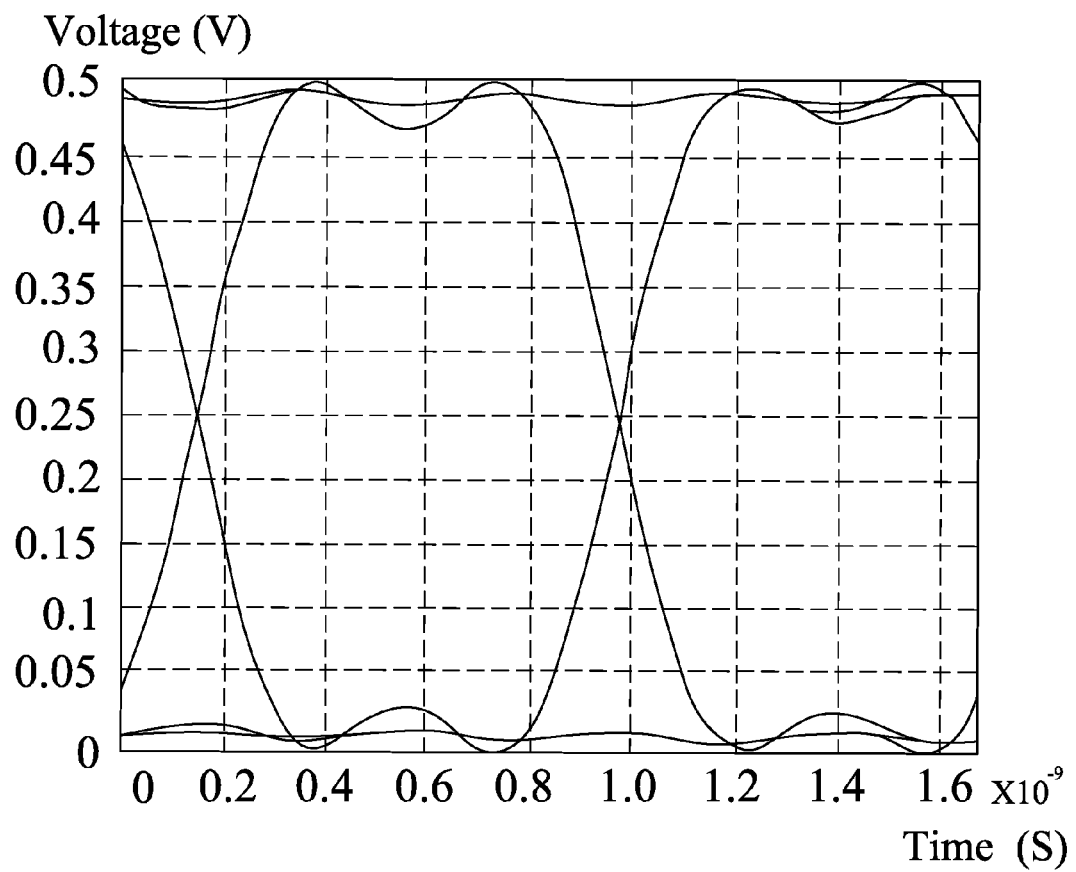
FIG. 5E is a serial signal eye diagram of the printed circuit board of FIG. 5A, showing no via stub structure.
Figure 6:
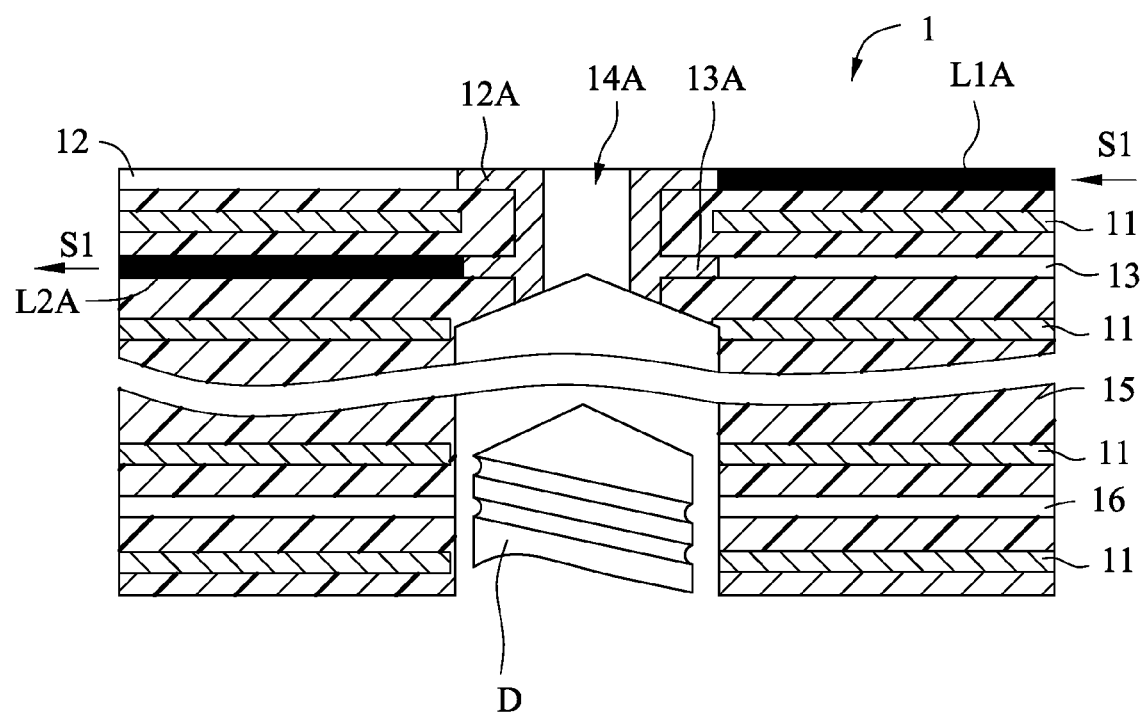
FIG. 6 is a schematic view of the printed circuit board of FIG. 5A, showing the via stub structure drilled.

Referring to FIG. 4, an experimentally acquired oscillogram of a channel response of the PCB 2 and the conventional PCB 1 are shown. The yield of the curves C2, C3, C4 of the PCB 2 is lower than that of C1 of the conventional PCB 1 before the frequency reaches 9 GHz. Accordingly, spiral impedance characteristic generated by the curved first portions LA1, LB1, LC1, LD1 of the first signal line LA, the second signal line LB, the third signal line LC, and the fourth signal line LD compensates for the capacitance characteristic of the via stub structure of PCB 2.

In this embodiment, the curved first portions LA1, LB1, LC1, LD1, all of which form the spiral should not exceed the area of the corresponding through hole 231 of the copper layer 23 to compensate the capacitance characteristic of the PCB 2, and the PCB 2 requires no added process. Along with decreased costs, the curved first portions LA1, LB1, LC1, LD1 generate impedance characteristic by the changes in the circuit to compensate the capacitance characteristic of the via stub structure.

It is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

What is claimed is:

1. A printed circuit board, comprising:
a first layout layer comprising a first signal line and second signal line, each comprising a curved first portion;
a second layout layer comprising a third signal line and a fourth signal line, each comprising a curved first portion, the first layout layer being disposed above the second layout layer;
at least a third layout layer disposed below the second layout layer; and
a first via and a second via through the first layout layer, the second layout layer and the third layout layer, the curved first portions of the first signal line and the third signal line being coupled to the first via, the curved first portions of the second signal line and the fourth signal line being coupled to the second via;
wherein the curved first portions of the first signal line and the third signal line are disposed around the first via to cooperatively generate a spiral inductance characteristic with respect to a portion of the third layout layer around the first via, the portion of the third layout layer around the first via includes a first via stub portion, the spiral inductance characteristic generated by the curved first portions of the first signal line and the third signal line substantially compensates the capacitance characteristic of the first via stub portion; and wherein the curved first portions of the second signal line and the fourth signal line are disposed around the second via to cooperatively generate a spiral inductance characteristic with respect to a portion of the third layout layer around the second via, the portion of the third layout layer around the second via includes a second via stub portion, the spiral inductance characteristic generated by the curved first portions of the second signal line and the fourth signal line substantially compensates the capacitance characteristic of the second via stub portion.

2. The printed circuit board as claimed in claim 1, wherein the curved first portions of the first signal line, the second signal line, the third signal line, and the fourth signal line are J-shaped, C-shaped, or other curved shape.

3. The printed circuit board as claimed in claim 1, wherein the first signal line and the second signal line each comprise a straight second portion connecting the curved first portions of the first signal line and the second signal line, respectively, the third signal line and the fourth signal line each comprise a straight second portion connecting the curved first portions of the third signal line and the fourth signal line, respectively, the first signal line and the second signal line disposed symmetrically on the first layout layer, the third signal line and the fourth signal line are disposed symmetrically on the second layout layer.

4. The printed circuit board as claimed in claim 3, wherein the widths of the curved first portions of the first signal line and the second signal line exceed those of the straight second portions, the widths of the curved first portions of the third signal line and the fourth signal line exceed those of the straight second portions.

5. The printed circuit board as claimed in claim 1, wherein the first signal line, the second signal line, the third signal line and the fourth signal line transmit a pair of transmitting signals.

6. The printed circuit board as claimed in claim 5, wherein the transmitting signals are a pair of serial signals or a pair of differential signals.

7. The printed circuit board as claimed in claim 1, wherein an isolation layer is disposed between the first layout layer and the second layout layer, and the first via and the second via are through the isolation layer.

8. The printed circuit board as claimed in claim 1, wherein two first conducting portions of the first layout layer are coupled to and disposed around the first via and the second via, respectively, and the curved first portions of the first signal line and the second signal line are disposed around the first via and the second via by the first conducting portions, and two second conducting portions of the second layout layer are coupled to and disposed around the first via and the second via, and the curved first portions of the third signal line and the fourth signal line are disposed around the first via and the second via by the second conducting portions.

9. The printed circuit board as claimed in claim 1, further comprising a copper foil layer including a through hole disposed between the first layout layer and the second layout layer, the first via and the second via passing through the through hole, wherein projections of the curved first portions of the first signal line, the second signal line, the third signal line and the fourth signal line on the copper foil layer are within an area of the through hole.

10. The printed circuit board as claimed in claim 1, wherein the spiral inductance characteristic generated by the curved first portions of the first signal line and the third signal line is between the first layout layer and the second layout layer, the spiral inductance characteristic generated by the curved first portions of the second signal line and the fourth signal line is between the first layout layer and the second layout layer.

11. The printed circuit board as claimed in claim 1, wherein the spiral inductance characteristic generated by the curved first portions of the first signal line and the third signal line cancels out the capacitance characteristic of the first via stub portion, the spiral inductance characteristic generated by the curved first portions of the second signal line and the fourth signal line cancels out the capacitance characteristic of the second via stub portion.

12. A printed circuit board, comprising:

a first layout layer comprising a first signal line and a second signal line;

a second layout layer comprising a third signal line and a fourth signal line, the first layout layer being disposed above the second layout layer;

at least a third layout layer disposed below the second layout layer; and a first via and a second via through the first layout layer, the second layout layer and the third layout layer;

wherein the first signal line and the third signal line are disposed around and spirally coupled to the first via for cooperatively generating a spiral inductance characteristic with respect to a portion of the third layout layer around the first via, the portion of the third layout layer around the first via includes a first via stub portion, the spiral inductance characteristic generated by the first signal line and the third signal line substantially compensates the capacitance characteristic of the first via stub portion; and wherein the second signal line and the fourth signal line are disposed around and spirally coupled to the second via for cooperatively generating a spiral inductance characteristic with respect to a portion of the third layout layer around the second via, the portion of the third layout layer around the second via includes a second via stub portion, the spiral inductance characteristic generated by the second signal line and the fourth signal line substantially compensates the capacitance characteristic of the second via stub portion.

13. The printed circuit board as claimed in claim 12, wherein the first signal line, the second signal line, the third signal line and the fourth signal line each comprise a curved first portion and a straight second portion connected with each other, respectively, and the first signal line and the second signal line are disposed symmetrically on the first layout layer, and the third signal line and the fourth signal line are disposed symmetrically on the second layout layer.

14. The printed circuit board as claimed in claim 13, wherein the curved first portions of the first signal line and the third signal line are disposed around and coupled to the first via to form a spiral, and the curved first portion of the second signal line and the fourth signal line are disposed around and coupled to the second via to form a spiral.

15. The printed circuit board as claimed in claim 13, wherein an isolation layer is disposed between the first layout layer and the second layout layer, and the first via and the second via are through the isolation layer.

16. The printed circuit board as claimed in claim 13, wherein the shapes of the curved first portions of the first signal line, the second signal line, the third signal line and the fourth signal line are J-shaped, C-shaped, or other curved shape.

17. The printed circuit board as claimed in claim 13, wherein the widths of the curved first portions of the first signal line and the second signal line exceed those of the straight second portions, and the widths of the curved first portions of the third signal line and the fourth signal line exceed those of the straight second portions.

18. The printed circuit board as claimed in claim 13, further comprising a copper foil layer including a through hole disposed between the first layout layer and the second layout layer, the first via and the second via passing through the through hole, wherein projections of the curved first portions of the first signal line, the second signal line, the third signal line and the fourth signal line on the copper foil layer are within an area of the through hole.

19. The printed circuit board as claimed in claim 12, wherein the spiral inductance characteristic generated by the first signal line and the third signal line is between the first layout layer and the second layout layer, the spiral inductance characteristic generated by the second signal line and the fourth signal line is between the first layout layer and the second layout layer.

20. The printed circuit board as claimed in claim 12, wherein the spiral inductance characteristic generated by the first signal line and the third signal line cancels out the capacitance characteristic of the first via stub portion, the spiral inductance characteristic generated by the second signal line and the fourth signal line cancels out the capacitance characteristic of the second via stub portion.

* * * * *